US005286678A

United States Patent [19]
Rastogi

[11] Patent Number: 5,286,678
[45] Date of Patent: Feb. 15, 1994

[54] SINGLE STEP SALICIDATION PROCESS

[75] Inventor: Rajiv Rastogi, Portland, Oreg.

[73] Assignee: Intel Corporation, Santa Clara, Calif.

[21] Appl. No.: 951,945

[22] Filed: Sep. 28, 1992

Related U.S. Application Data

[63] Continuation of Ser. No. 785,946, Oct. 31, 1991, abandoned.

[51] Int. Cl.$^5$ ............................................. H01L 21/28
[52] U.S. Cl. .................................... 437/200; 437/192
[58] Field of Search ................................ 437/200, 192

[56] References Cited

U.S. PATENT DOCUMENTS

| | | | |
|---|---|---|---|
| 4,551,908 | 11/1985 | Nagasawa et al. | 437/200 |
| 4,845,055 | 7/1989 | Ogata | 437/247 |
| 4,877,748 | 10/1989 | Havemann | 437/192 |
| 4,940,509 | 7/1990 | Tso et al. | 156/653 |
| 4,966,868 | 10/1990 | Murali et al. | 437/200 |
| 5,023,201 | 6/1991 | Stanasolovich et al. | 437/200 |
| 5,043,300 | 8/1991 | Nulman | 437/192 |

OTHER PUBLICATIONS

N. de Lanerolle, D. Hoffman, and D. Ma, "Titanium silicide growth by rapid-thermal processing of Ti films deposited on lightly doped and heavily doped silicon substrates," J. Vac. Sci. Technol. B5(6), pp. 1689-1695 (Nov./Dec. 1987).

D. Pramanik, M. Deal and A. N. Saxena, "Formation of Titanium Silicide by Rapid Thermal Annealing," Semiconductor International, pp. 94-100 (May 1985).

W. Bensch et al., "The Formation of Ti Silicides by Rapid Thermal Procesing: . . . " *Reactivity of Solids*, vol. 7, No. 3, Aug. 1989, pp. 249-262.

Okamoto et al., "Ti Silicidation by Halogen Lamp Annealing", *Mat. Res. Soc. Symp. Proc*, vol. 35, 1985, pp. 471-476.

Billson et al., "Ti-Si and SiO$_2$ Reactions Controlled by Low Temp. RTA", *J. Vac. Sci. and Technol. A*, Proc. of the 32nd Symposium of American Vacuum Society, vol. 4, No. 3, pt. 1, 1986, pp. 993-997.

Primary Examiner—Brian E. Hearn
Assistant Examiner—Laura M. Holtzman
Attorney, Agent, or Firm—Blakely, Sokoloff, Taylor & Zafman

[57] ABSTRACT

The present invention generally involves the fabrication of semiconductor devices so as to reduce the active region to interconnect interface resistivity. Fabrication begins by forming active regions on a semiconductor device. Next, a titanium metal of approximately 900 Å thickness is deposited on the semiconductor device. The semiconductor device is then annealed in a single step to form the interconnects.

8 Claims, 20 Drawing Sheets 5,286,678

SINGLE STEP SALICIDATION PROCESS

This is a continuation of application Ser. No. 07/785,946, filed Oct. 31, 1991, abandoned.

FIELD OF THE INVENTION

The present invention relates to the field of fabrication of semiconductor devices. More specifically, the present invention relates to the field of fabrication of the interface between device active regions and interconnects in semiconductor devices.

BACKGROUND OF THE INVENTION

In semiconductor device fabrication processes it is generally desirable to minimize the total number of steps in the process. Furthermore, it is generally desirable to allow the greatest latitude in fabrication process parameters while still yielding satisfactory semiconductor device characteristics. Stated differently, the simpler and the more robust the process the better suited it is for large scale manufacturing of semiconductor devices and the greater the number of devices which can be manufactured.

One of the semiconductor device characteristics which is of concern for most device types (e.g., microprocessors, memory devices, etc.), is the resistance of the interface between the active regions (source, drain, etc.) of the device and the contacts or interconnects (metalization lines, etc.) to other devices. The greater the resistance at this interface the more power that is required to operate the device, the greater the heat generated and the slower the device operation. Therefore, it is generally desirable to have the interface resistivity be as low as possible.

One commonly known prior art fabrication process (explained further below) used to minimize the interface resistivity requires multiple steps and relatively tight fabrication process parameters in order to yield satisfactory resistivity values. In contrast, the present invention reduces the number of steps as compared to the prior art and allows greater fabrication parameter variation while yielding equivalent, or even improved, semiconductor device films with lower interface resistivity values as compared to the prior art.

SUMMARY AND OBJECTS OF THE INVENTION

An objective of the present invention is to provide an improved method of semiconductor device fabrication with reduced steps.

Another objective of the present invention is to provide an improved method of semiconductor device fabrication allowing greater fabrication process parameter variation.

A further objective of the present invention is to provide an improved method of semiconductor device fabrication with low active region to interconnect interface resistivity.

A still further objective of the present invention is to provide an improved method of semiconductor device fabrication with reduced fabrication process time.

A still further objective of the present invention is to provide an improved method of semiconductor device fabrication with improved film uniformity.

The foregoing and other advantages are provided for by a method of fabricating a semiconductor device with reduced resistivity between active regions and interconnects, said improved method comprising forming said active regions on said semiconductor device, depositing a titanium metal of approximately 900 Å thickness on said active regions, annealing said semiconductor device in a singl step and forming said interconnects on said semiconductor device.

Other objects, features and advantages of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

PRIOR ART PROCESS

Figure 1:
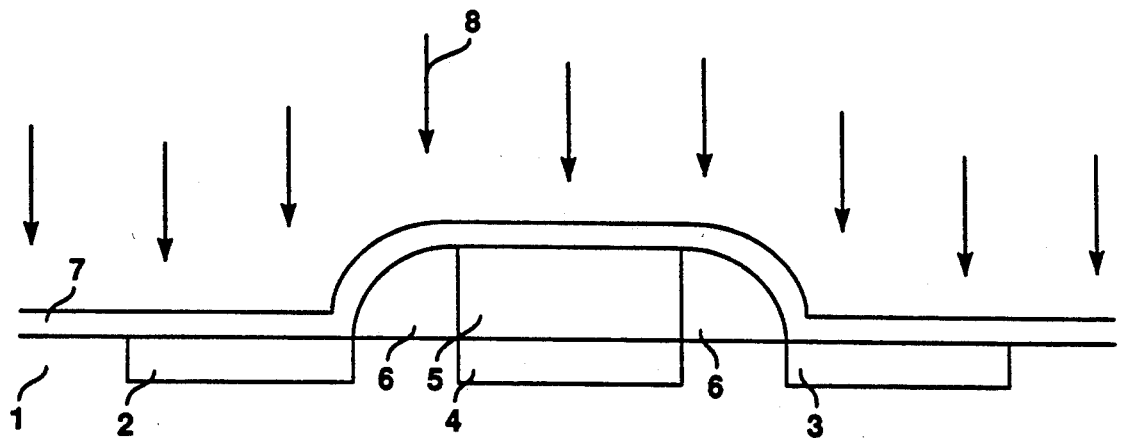
FIG. 1 depicts the earlier steps of the fabrication process of the prior art and the present invention.

Referring now to FIG. 1, the typical fabrication process of the prior art will first be explained. Initially, in the fabrication of a semiconductor device, active regions are formed on a wafer comprised of a silicon 1 substrate. Active regions are comprised of, for instance, a source 2 region and a drain 3 region and are formed on opposing sides of a gate 4. A conductive layer of polysilicon 5 is then formed on the gate 4. Oxide 6 spacers are then formed on both sides of the gate 4 and polysilicon 5 structure to electrically isolate (prevent electrical shorts between) the source 2 and the drain 3 from the gate 4. Next the wafer goes through a precleaning process to remove the native oxide formed on the silicon 1 when the wafer is exposed to the oxide ambient. The wafer is then placed in a sputtering machine where approximately 900 Å of titanium 7 is deposited on the wafer in an environment maintained at 150°–200° centigrade (hereinafter "C").

Next the wafer is implanted with silicon 8 which travels through the titanium 7 and perforates the interface between the titanium 7 and the underlying silicon 1 substrate, the source 2, the drain 3, the oxide 6 spacers and the polysilicon 5 and gate 4 structure. The purpose of the silicon 8 implant is to assist the migration of the silicon 1 from the substrate to the titanium 7 in the following annealing steps. Note that the silicon 8 implantation step is not a required step but does aid in the robustness of the process.

Next the wafer goes through a low temperature anneal. Annealing is a process whereby the ambient temperature (approximately 25°–27° C.) is raised to a specified temperature for a specified period of time and in a specified gaseous environment. Annealing alters the physical and chemical properties (e.g., crystal structure and grain size) of the film of the wafer devices. Annealing can be done in a diffusion furnace or more rapidly in a rapid thermal processing system which quickly raises the ambient temperature to the specified temperature.

In the prior art process the low temperature anneal is performed at 600° C. (±5° C.) for 60 seconds with a ramp rate of 50° C. per second while maintaining a nitrogen gas flow rate of 3 liters per minute. The annealing process causes silicon to migrate from the underlying silicon 1 substrate through the source 2, the drain 3, the oxide 6 spacers and the gate 4 and polysilicon 5 structure to the titanium 7. Note that the implanted silicon 8 perforations facilitate faster and more uniform silicon 1 migration which results in a more uniform film being formed by the annealing process.

When the silicon 1 from the substrate migrates to the titanium 7, tisalicide is formed. Tisalicide refers to a titanium silicide ($TiSi_x$) which is self-aligned (no masking or etching steps needed) to the active regions of the device. Tisalicide formation lowers the interface resistivity.

Although tisalicide is formed by the low temperature anneal, the tisalicide that is formed is not entirely the lower resistivity C54 phase ($TiSi_2$) of tisalicide that is desired. Instead, the low temperature anneal of the prior art process primarily forms a higher resistivity C49 phase ($TiSi_x$) of tisalicide and thus further processing has been required in the prior art to convert the C49 phase ($TiSi_x$) of tisalicide to the C54 phase ($TiSi_2$) of tisalicide.

Figure 2:
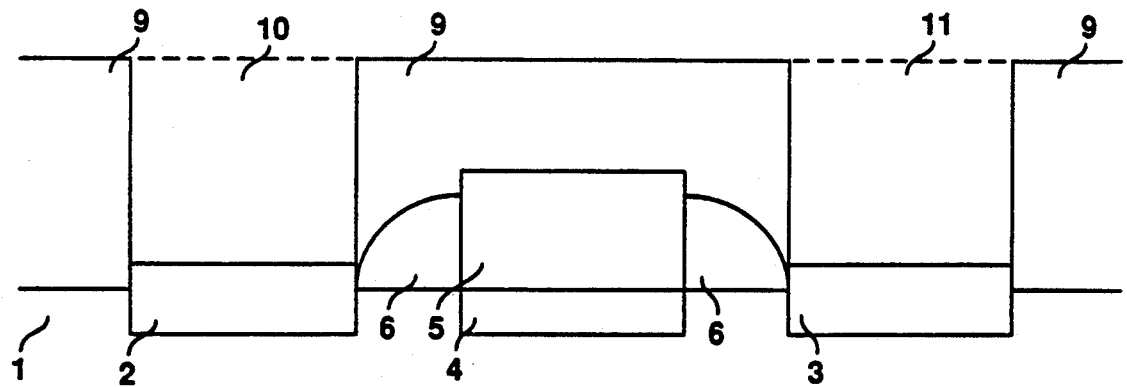
FIG. 2 depicts the later steps of the fabrication process of the prior art and the present invention.

Referring now to FIG. 2, the wafer is next subjected to a wet selective etch. The wet selective etch removes any unreacted titanium 7 as well as any titanium nitride formed by the titanium 7 while in the nitrogen atmosphere of the low temperature anneal. The wet selective etch also removes the tisalicide formed on the oxide 6 spacers (which is removed relatively easily because the adherence properties of tisalicide to oxide are much less than that of tisalicide to the active regions) during the low temperature anneal.

The wet selective etch is performed by dipping the wafers in an "RCA clean" (a chemical solution consisting of 1 part ammonium flouride to 1 part hydrogen peroxide to 5 parts hydrogen dioxide). The RCA clean wet selective etch solution is maintained at a temperature of 80° C. (±5° C.) and the wafer is dipped for nine minutes.

Next the wafers are exposed to a high temperature anneal. The high temperature anneal converts the remaining higher resistivity C49 phase ($TiSi_x$) of tisalicide to the desired lower resistivity C54 phase ($TiSi_2$) of tisalicide. In the prior art process the high temperature anneal is performed at 900° C. (±50° C.) for 20 seconds with a ramp rate of 50° C. per second while maintaining a nitrogen gas flow rate of 3 liters per minute.

Finally, a resist 9 is spun on the wafer and contact holes are etched over the source 2 and drain 3 regions. After the contact holes are etched, metalization 10 & 11 interconnects are formed thus making contact with the active regions of the device. Lastly, a passivation layer (not shown in the figure) is formed over the wafer to protect the underlying device structures.

Results of Prior Art Process

As was stated above, it is generally desirable to have the interface (between the active regions and the interconnects) resistivity be as low as possible. It has generally be desired in the art to have bulk resistivity values less than or equal to 15 micro ohm centimeters. These desired values translate to desired sheet resistance values of roughly 1 to 3 ohms per square with a starting titanium film thickness of approximately 900 Å. To that end, the following reviews measured interface resistivity values after each step of the prior art process.

Figure 3:
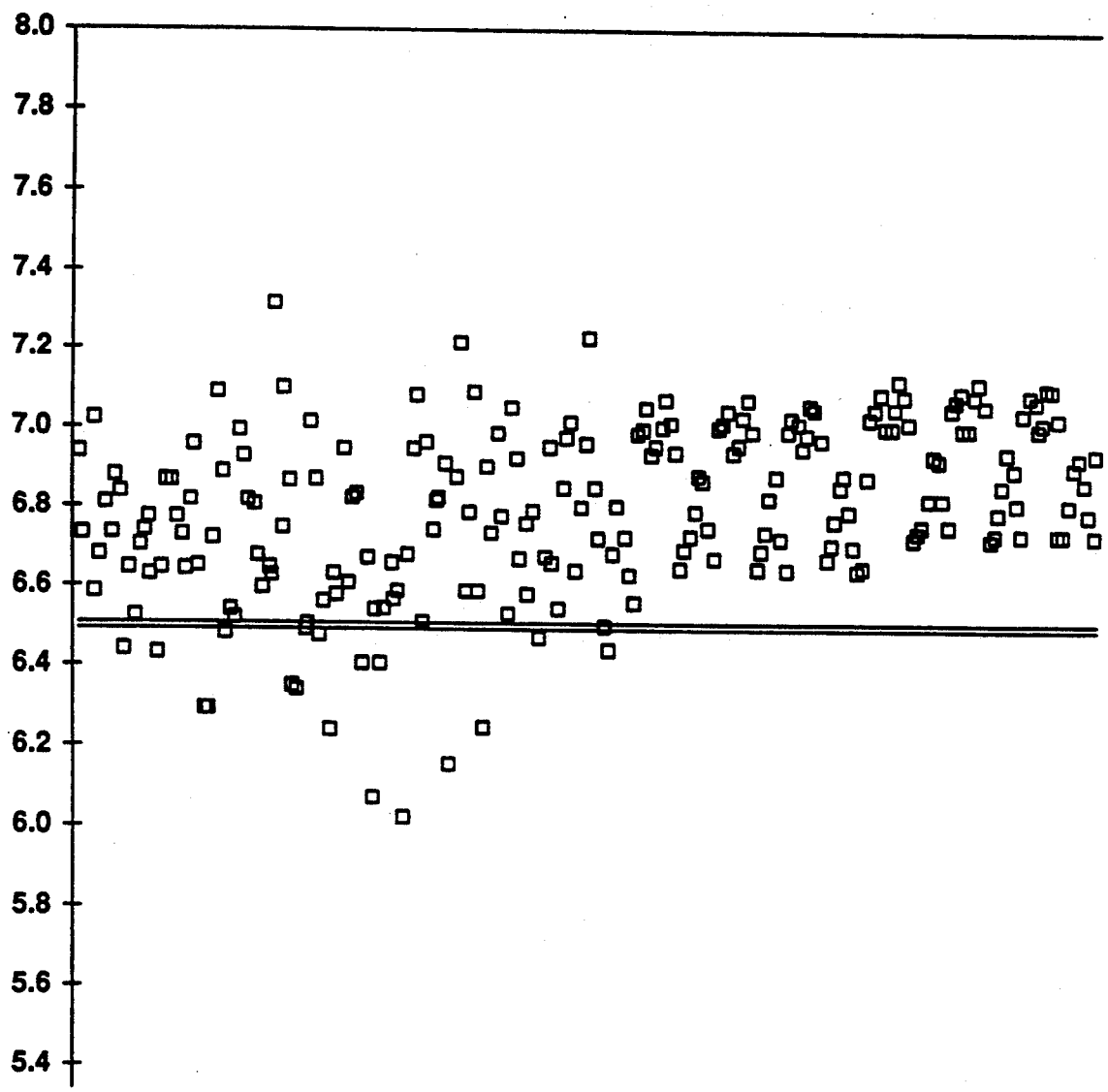
FIG. 3 depicts a trend chart of the prior art process after titanium deposition.

Referring now to FIG. 3, a trend chart can be seen of the sheet resistance of the film after the titanium 7 deposition of approximately 900 Å. With 248 wafers tested, the mean sheet resistance is 6.79 ohms per square with a standard deviation of 0.22.

Figure 4:
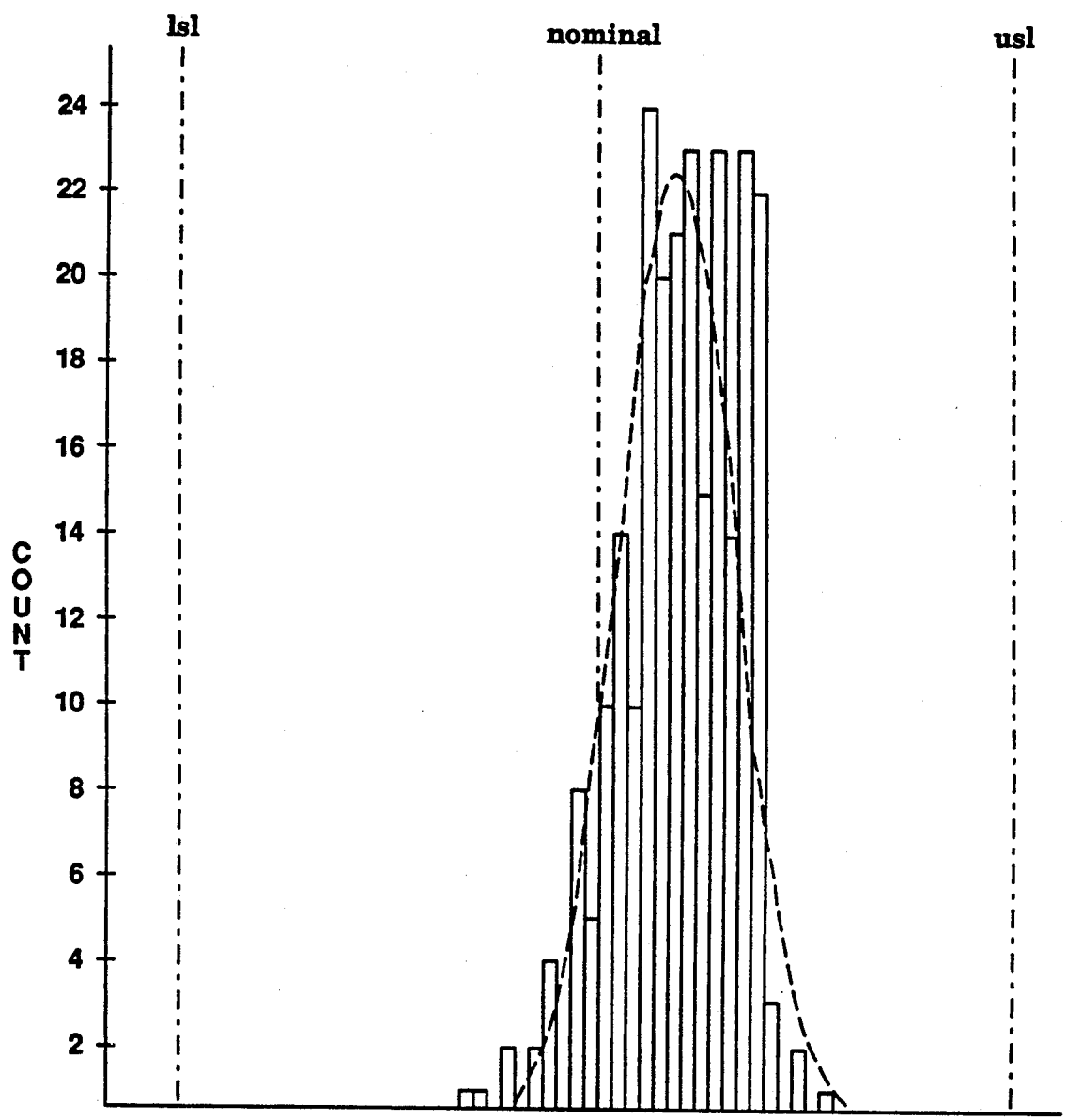
FIG. 4 depicts a capability plot of the prior art process after titanium deposition.

Referring now to FIG. 4, a capability plot can be seen of the sheet resistance of the film after titanium 7 deposition. In a capability plot Cp indicates how tightly the resulting sheet resistance values are grouped together and Cpk indicates how close the resulting sheet resistance values are to a target point (nominal value) given a lower specification limit and an upper specification limit. It is generally desirable to have both Cp and Cpk greater than or equal to 1 (note: if both Cp and Cpk are equal to 1 then the resulting values would be evenly distributed across the specification range). Stated differently, the higher the values of Cp and Cpk, the more robust a given process is (i.e., control of the process improves with higher Cp and Cpk values).

With 248 wafers tested and with a lower specification limit of 5.0 ohms per square and an upper specification limit of 8.0 ohms per square, FIG. 4 shows a Cp value of 2.28 and a Cpk value of 1.84.

Figure 5:
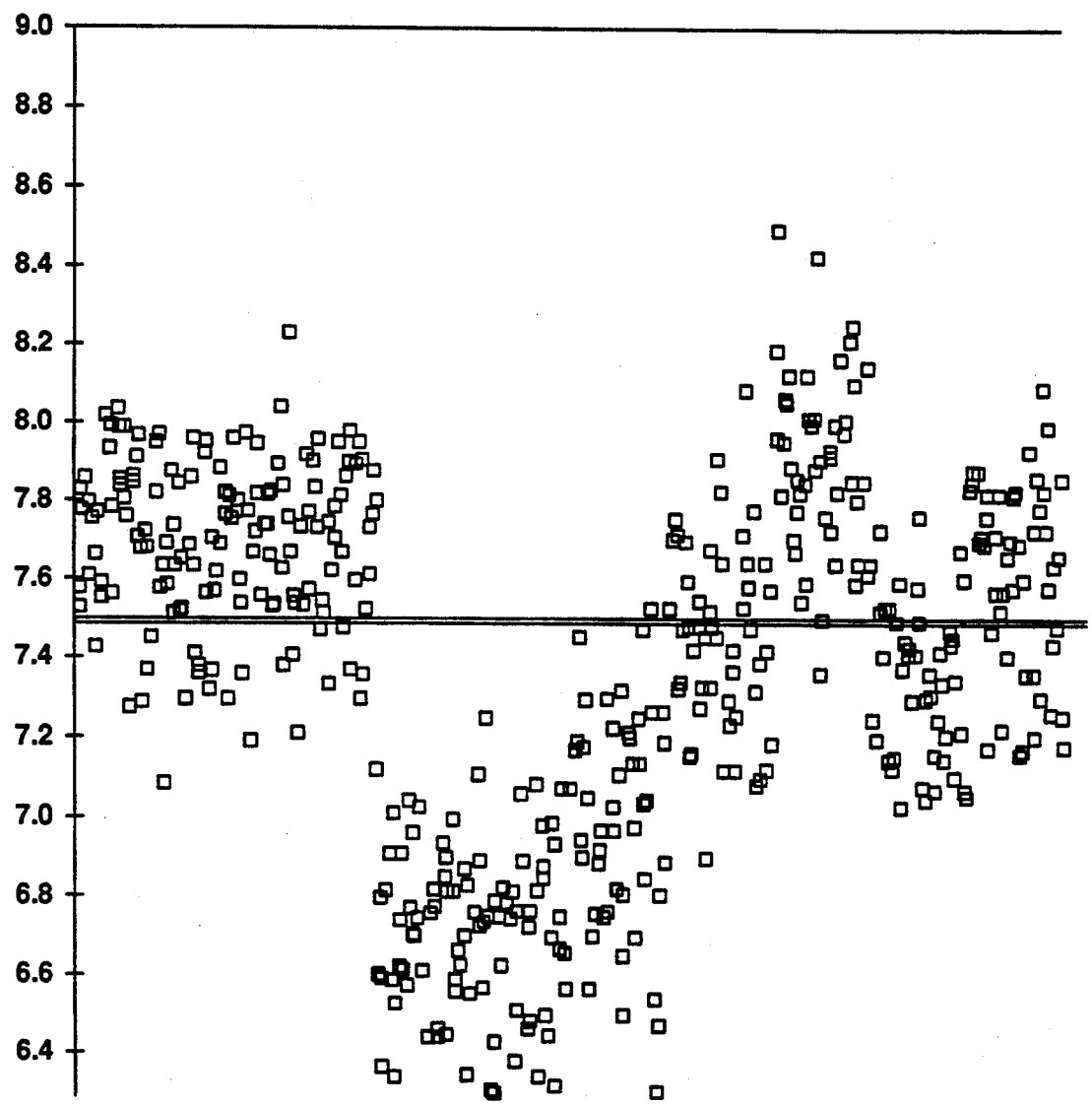
FIG. 5 depicts a trend chart of the prior art process after silicon implantation.

Referring now to FIG. 5, a trend chart can be seen of the sheet resistance of the film after the silicon 8 implantation. With 489 wafers tested, the mean sheet resistance is 7.37 ohms per square with a standard deviation of 0.49.

Figure 6:
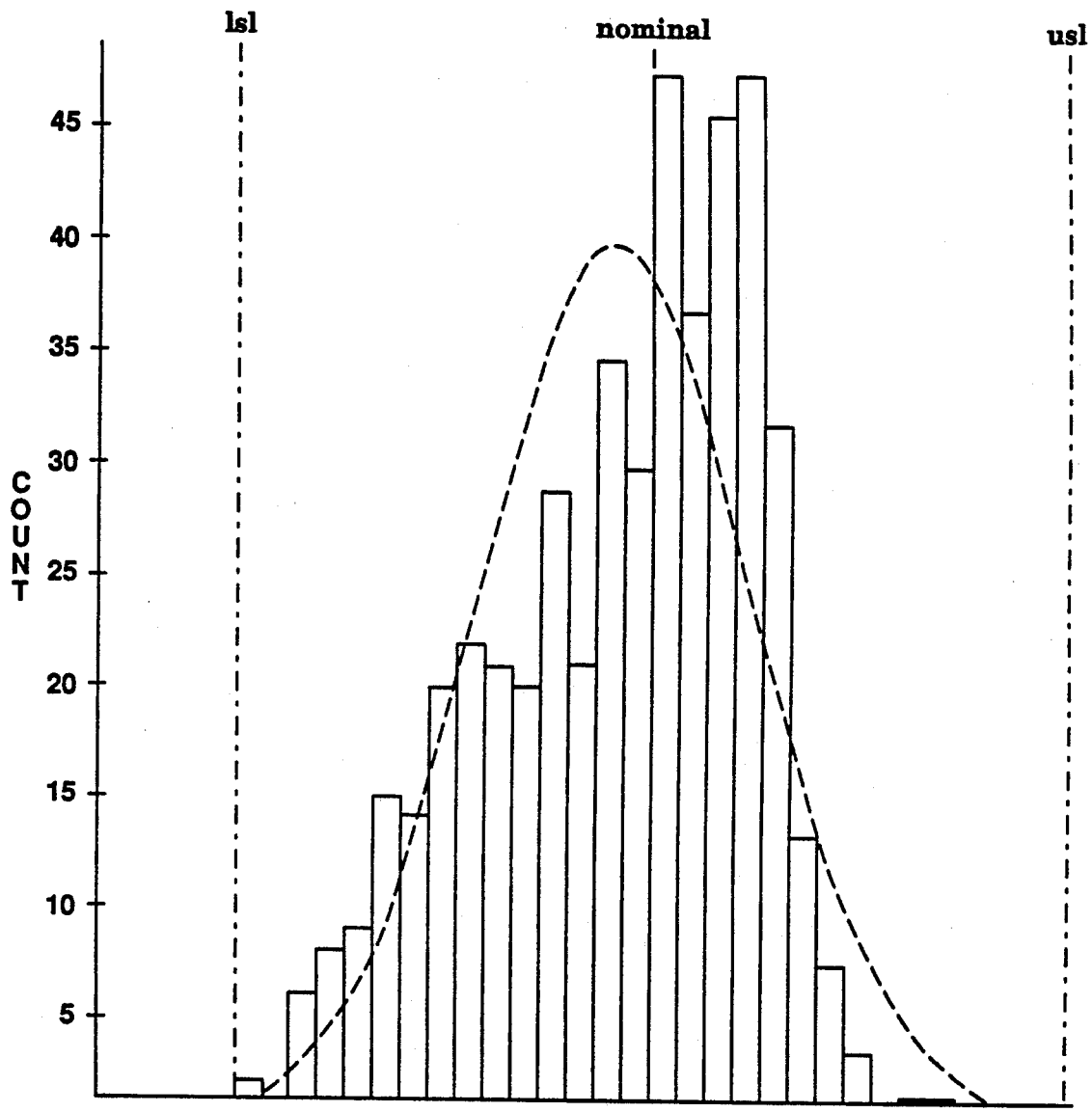
FIG. 6 depicts a capability plot of the prior art process after silicon implantation.

Referring now to FIG. 6, a capability plot can be seen of the sheet resistance of the film after the silicon 8 implantation. With 489 wafers tested and with a lower specification limit of 6.0 ohms per square and an upper specification limit of 9.0 ohms per square, the resulting Cp value is 1.03 and the resulting Cpk value is 0.94.

Figure 7:
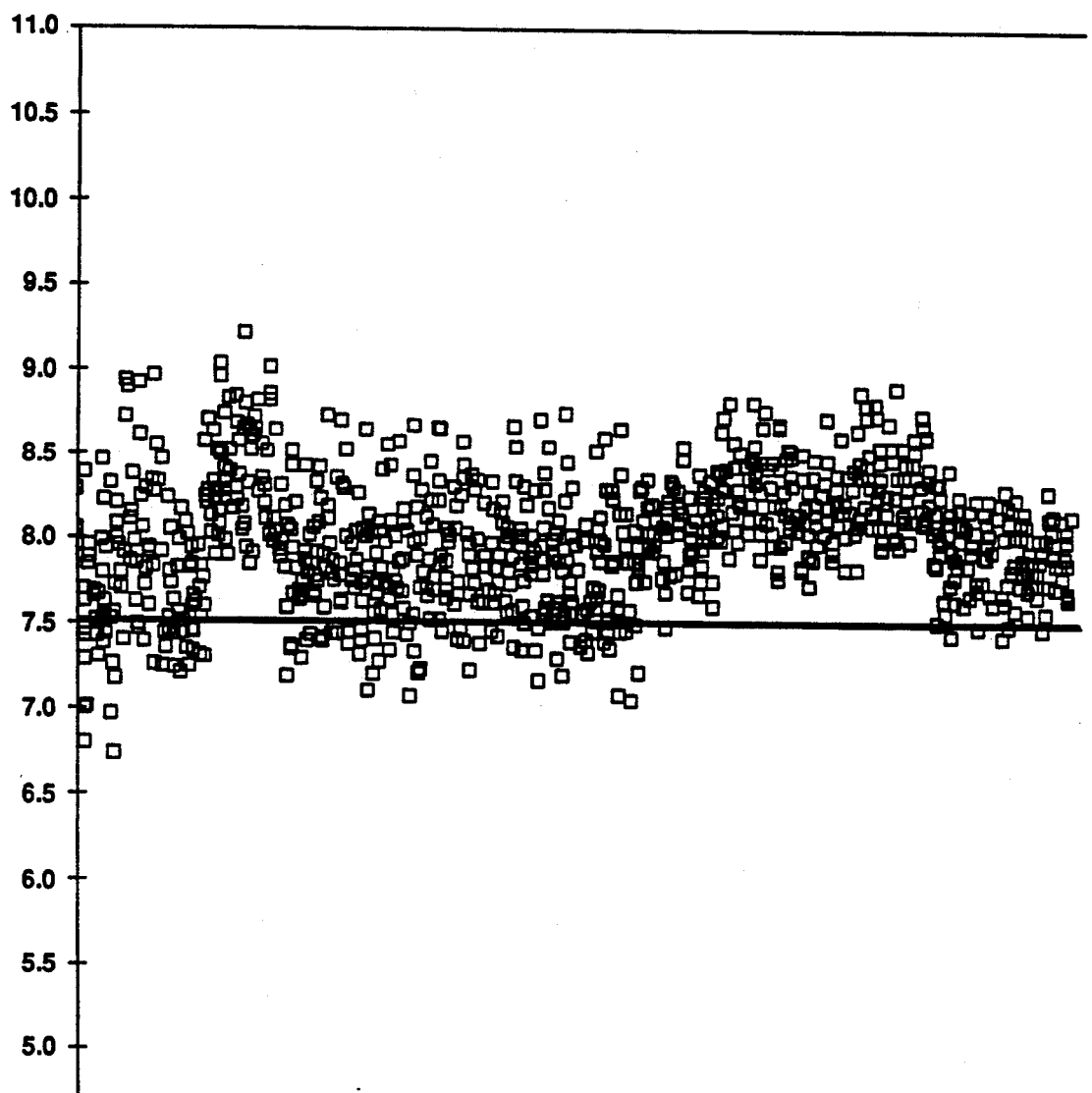
FIG. 7 depicts a trend chart of the prior art process after the low temperature anneal.

Referring now to FIG. 7, a trend chart can be seen of the sheet resistance of the film after the low temperature anneal. With 1100 wafers tested, the mean sheet resistance is 7.98 ohms per square with a standard deviation of 0.37.

Figure 8:
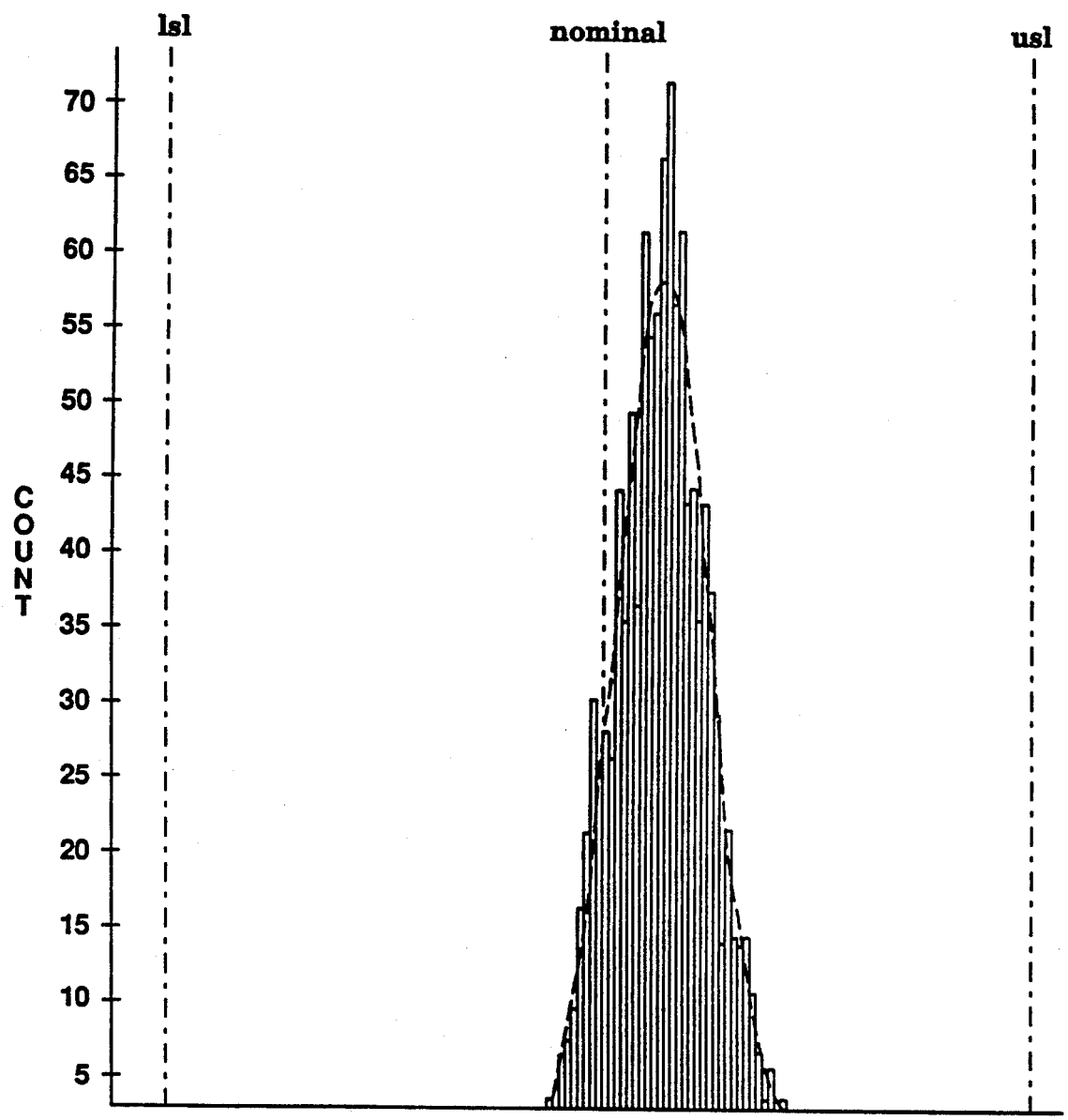
FIG. 8 depicts a capability plot of the prior art process after the low temperature anneal.

Referring now to FIG. 8, a capability plot can be seen of the sheet resistance of the film after the low temperature anneal. With 1100 wafers tested and with a lower specification limit of 4.0 ohms per square and an upper specification limit of 11.0 ohms per square, the resulting Cp value is 3.12 and the resulting Cpk value is 2.70.

Figure 9:
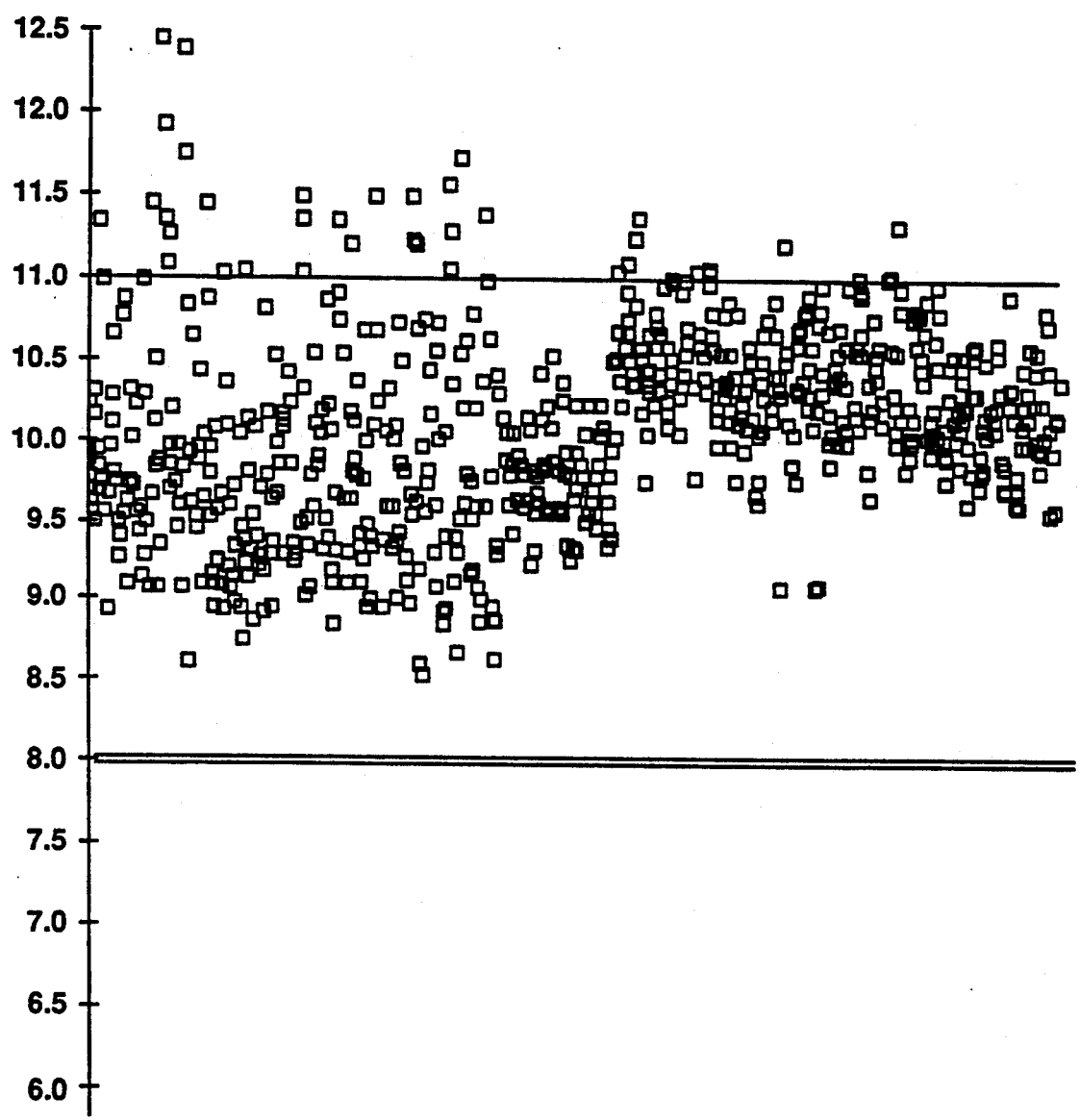
FIG. 9 depicts a trend chart of the prior art process after wet selective etch.

Referring now to FIG. 9, a trend chart can be seen of the sheet resistance of the film after the wet selective etch. With 709 wafers tested, the mean sheet resistance is 10.07 ohms per square with a standard deviation of 0.60.

Figure 10:
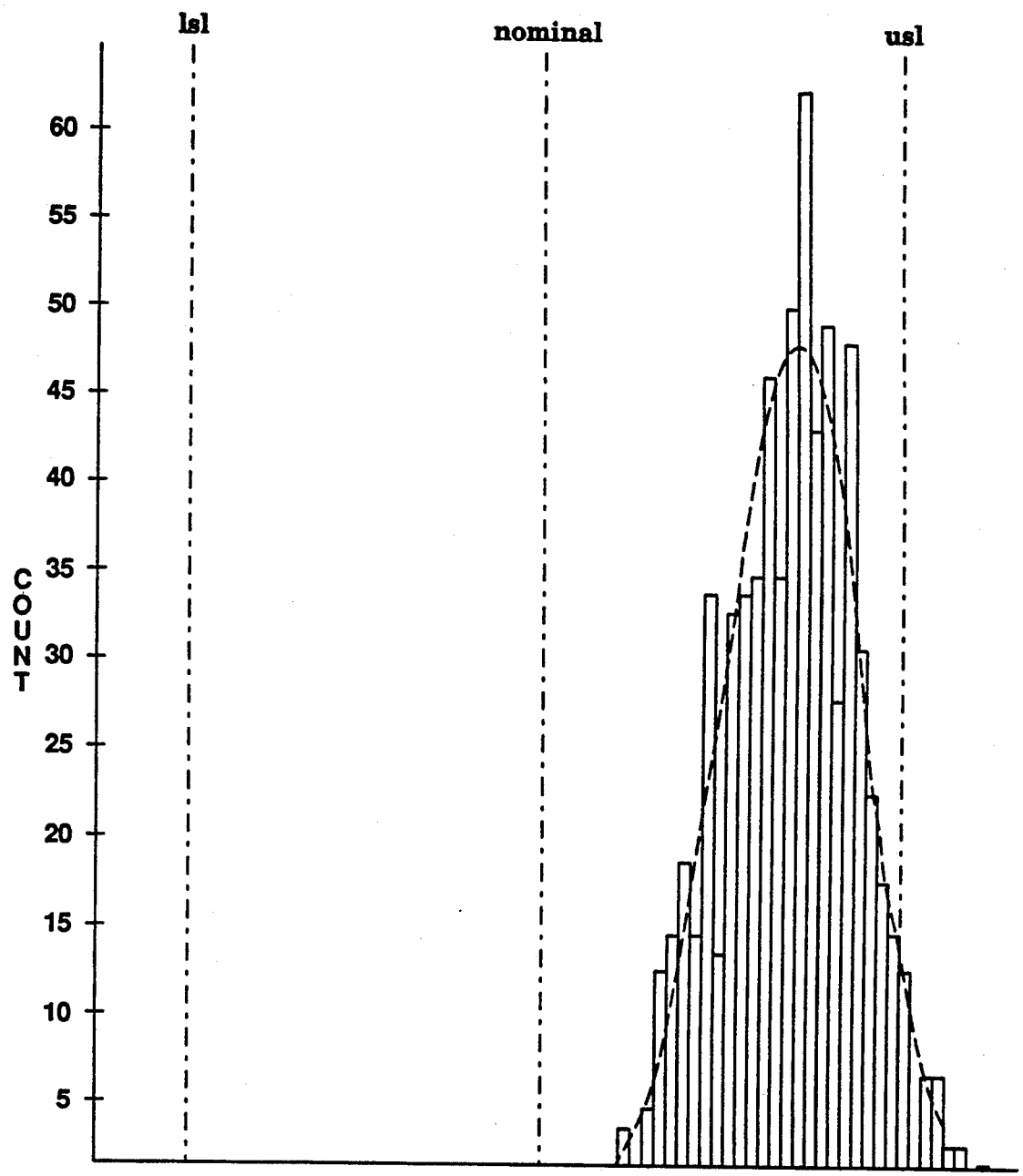
FIG. 10 depicts a capability plot of the prior art process after wet selective etch.

Referring now to FIG. 10, a capability plot can be seen of the sheet resistance of the film after the wet selective etch. With 709 wafers tested and with a lower specification limit of 5.0 ohms per square and an upper specification limit of 11.0 ohms per square, the resulting Cp value is 1.67 and the resulting Cpk value is 0.52. Note that in FIG. 10 Cp is greater than 1 which indicates that the results are well grouped. However, Cpk is much less than 1 which indicates that the resulting values are greatly skewed. In this case, the resulting values are skewed towards the upper limit of desired sheet resistance values.

Figure 11:
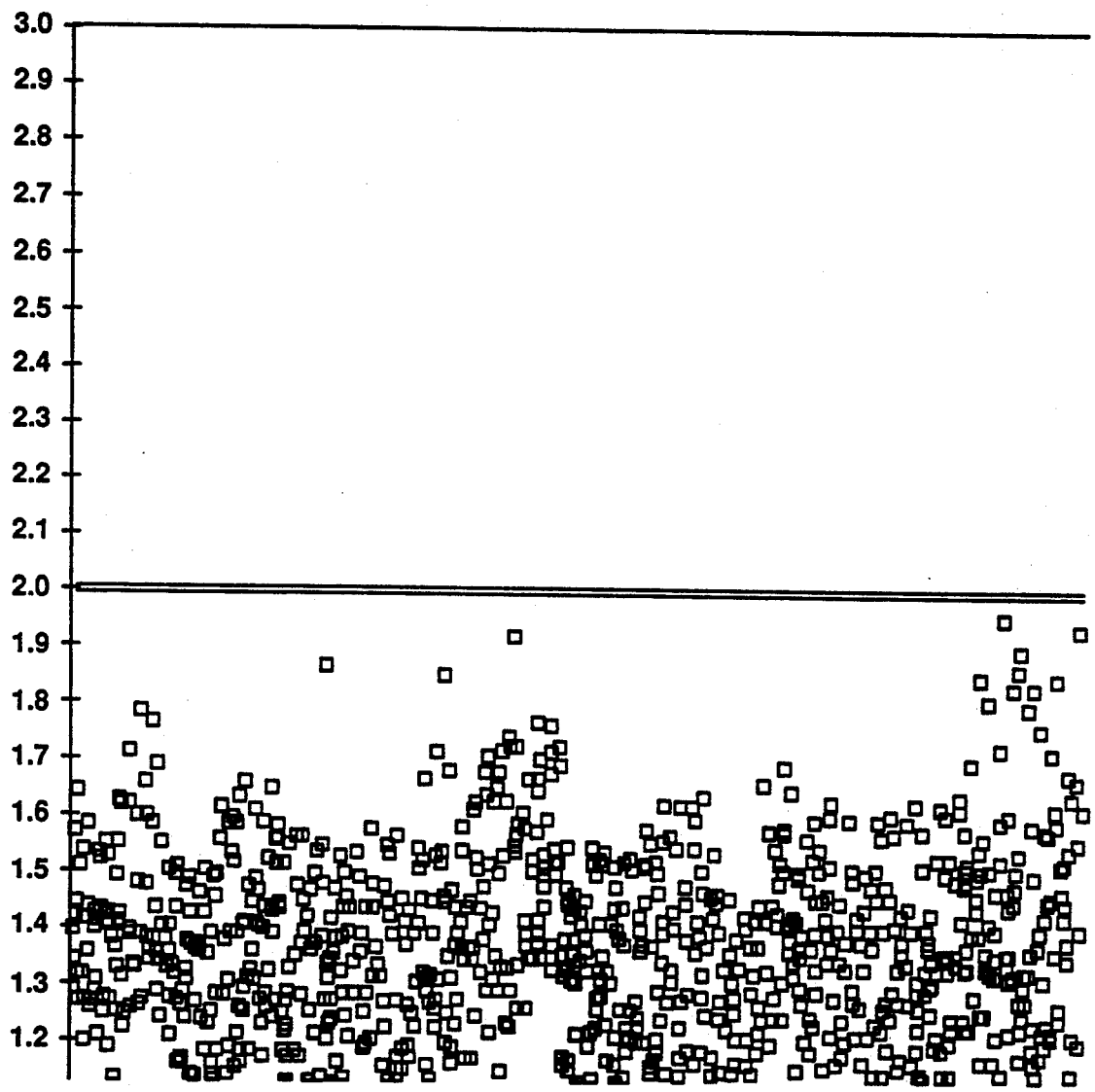
FIG. 11 depicts a trend chart of the prior art process after the high temperature anneal.

Referring now to FIG. 11, a trend chart can be seen of the sheet resistance of the film after the high temperature anneal. With 1000 wafers tested, the mean sheet resistance is 1.37 ohms per square with a standard deviation of 0.17. Given a starting titanium film thickness of approximately 900 Å, this translates to a bulk resistivity value of 12.24 micro ohm centimeters.

Figure 12:
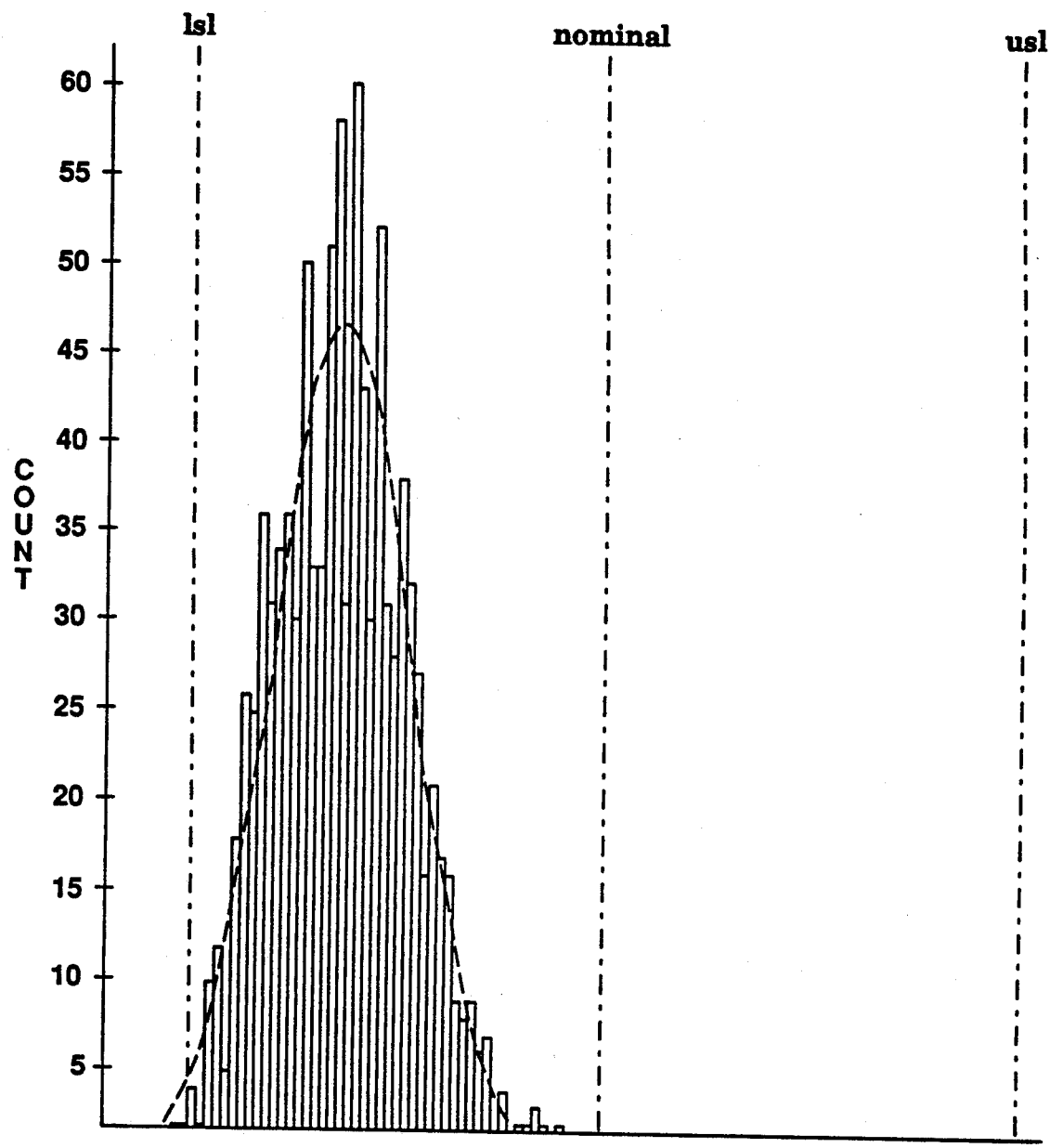
FIG. 12 depicts a capability plot of the prior art process after the high temperature anneal.

Referring now to FIG. 12, a capability plot can be seen of the sheet resistance of the film after the high temperature anneal. With 1000 wafers tested and with a lower specification limit of 1.0 ohms per square and an upper specification limit of 3.0 ohms per square, the resulting Cp value is 1.95 and the resulting Cpk value is 0.71. Note that in FIG. 12 Cp is greater than 1 which indicates that the results are well grouped. However, Cpk is again much less than 1 which again indicates that the resulting values are greatly skewed. In this case, the resulting values are skewed towards the lower limit of desired sheet resistance values thus again indicating a lack of process control.

Figure 13:
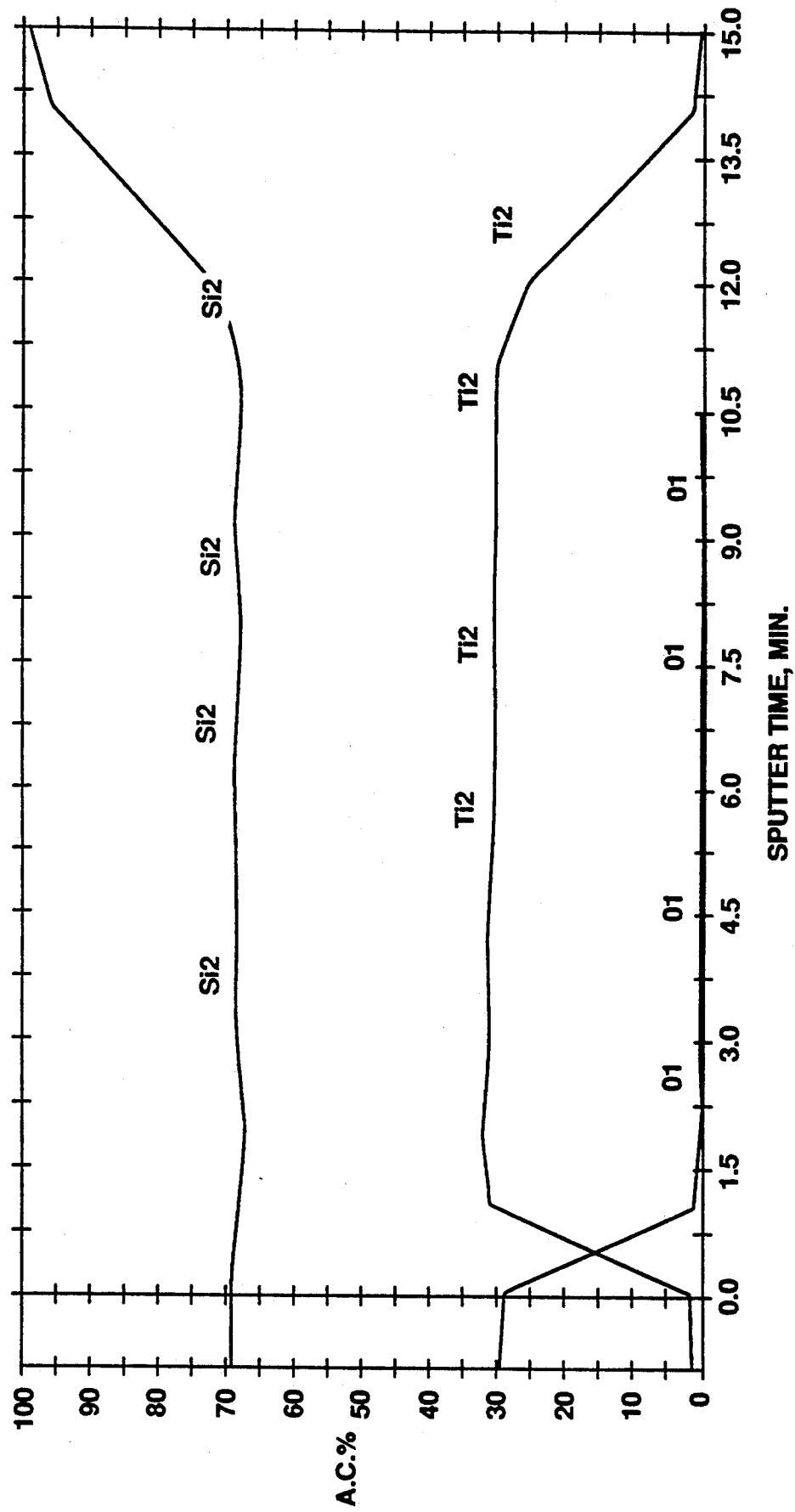
FIG. 13 depicts an auger analysis of the tisalicide film of a wafer of the prior art process.

Referring now to FIG. 13, an auger analysis can be seen of the tisalicide film after the high temperature anneal. The auger analysis shows the resulting atomic content percentage as a function of how long (in minutes) titanium 7 is sputtered onto the wafer. The stoichiometry of the tisalicide formed with the process of the prior art as calculated from the auger analysis of FIG. 13 results in a value of 2.2 which indicates that there is an approximate ratio of 2.2 titanium to 1.0 silicon. Therefore, the tisalicide formed by the prior art two anneal step process is almost entirely of the desired lower resistivity C54 phase (TiSi$_2$) of tisalicide.

Present Invention Process

Referring again to FIG. 1, the process of the present invention will now be reviewed and which also begins with formation of the active regions 2 & 3 and gate 4 on the silicon 1 substrate, followed by pre-cleaning the water, sputtering titanium 7, and implanting silicon 8. Then, rather than following the prior art process of a low temperature anneal followed by a high temperature anneal to obtain the lower resistivity C54 phase (TiSi$_2$) of tisalicide, the present invention is able to obtain the desired C54 phase (TiSi$_2$) of tisalicide using a single annealing step.

The single step anneal of the present invention is performed at 640° C. (±10° C.) for 90 seconds with a ramp rate of 90° C. per second while maintaining a nitrogen gas flow rate of 2 liters per minute. Note that the single step anneal of the present invention allows greater process parameter variation (640° C.±10° C.) than does the prior art process (600° C.±5° C.).

The single step anneal of the present invention is followed by a wet selective etch, again to remove the tinitride and to remove the tisalicide formed on the oxide 6 spacers, followed by (referring again to FIG. 2) a resist, etching of contact holes, forming metalization 10 & 11 interconnects and a passivation layer.

Thus, in the present invention, not only is an entire annealing step eliminated over the prior art, but the process parameters are also less stringent thus providing for better device manufacturability. Furthermore, as is explained below, the process of the present invention yields improved film uniformity over the prior art process.

Results of Present Invention Process

Figure 14:
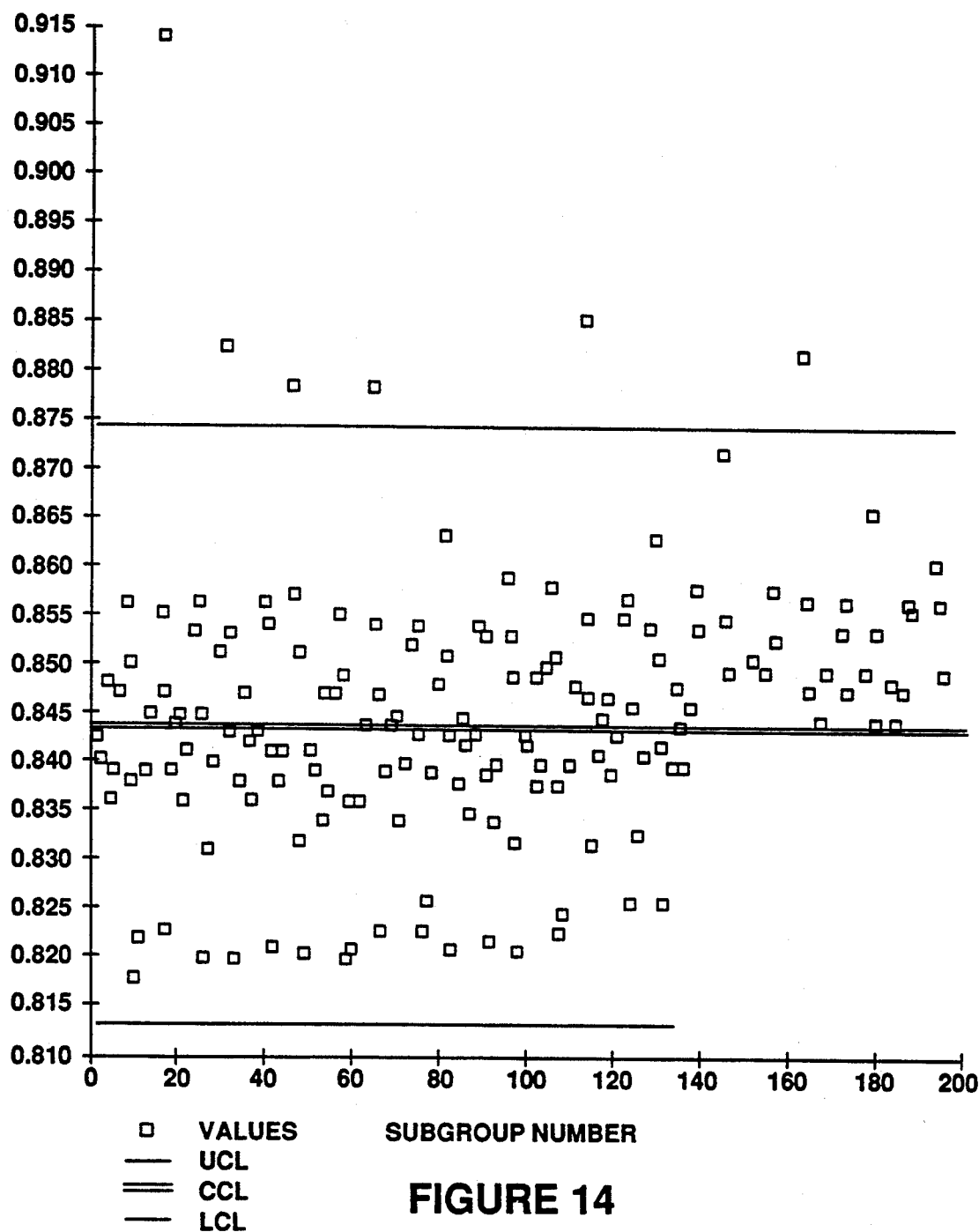
FIG. 14 depicts a trend chart of the present invention process after the single step anneal.

Referring now to FIG. 14, a trend chart can be seen of the sheet resistance of the film after the single step anneal of the present invention. With 196 wafers tested, the mean sheet resistance is 0.84 ohms per square with a standard deviation of 0.01.

Figure 15:
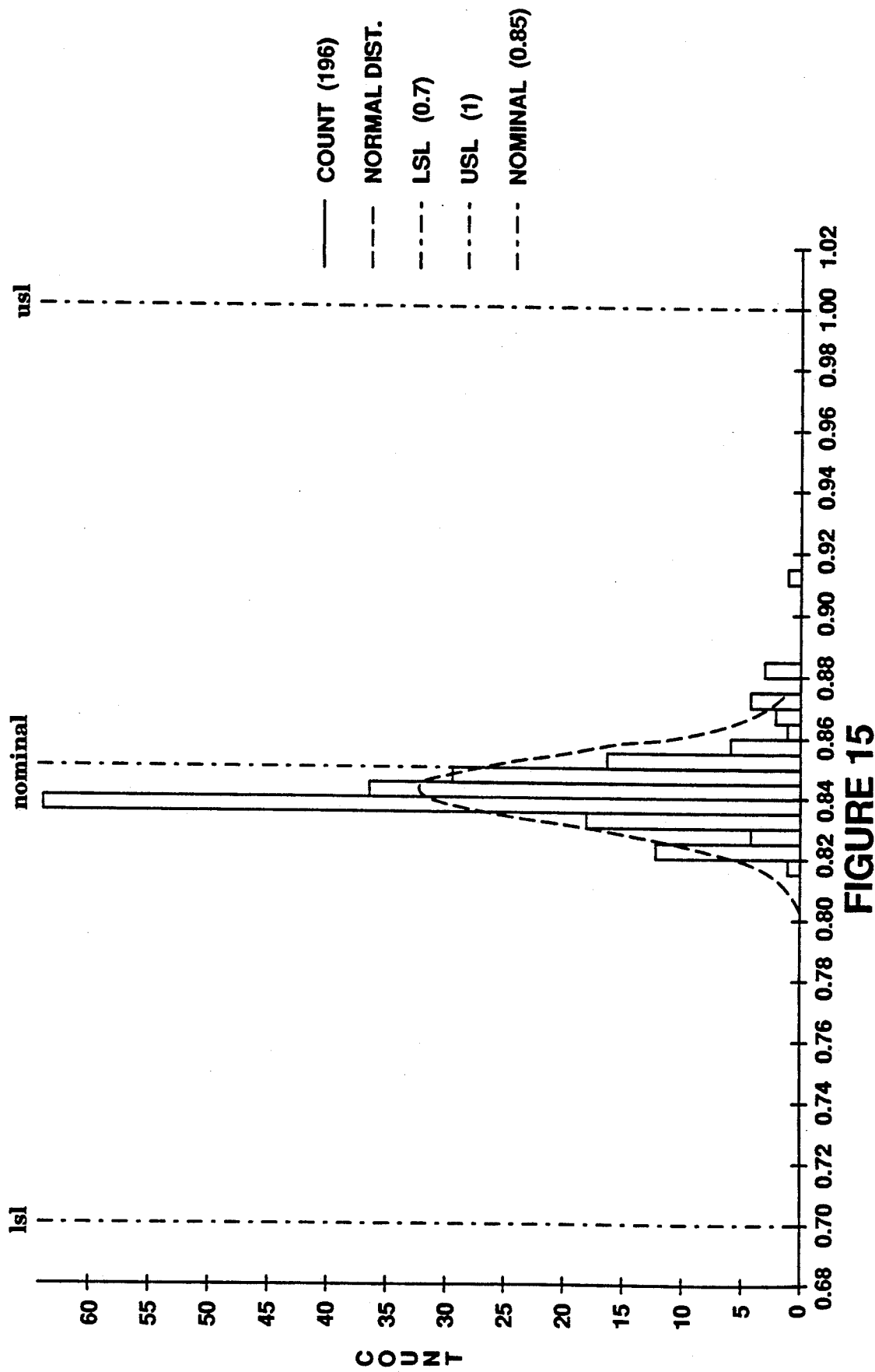
FIG. 15 depicts a capability plot of the present invention process after the single step anneal.

Referring now to FIG. 15, a capability plot can be seen of the sheet resistance of the film after the single step anneal of the present invention. With 196 wafers tested and with a lower specification limit of 0.70 ohms per square and an upper specification limit of 1.00 ohms per square, the resulting Cp value is 4.15 and the resulting Cpk value is 3.94. Note that in FIG. 15 both Cp and Cpk are much greater than 1 which indicates that the resulting values with the process of the present invention are both tightly grouped and strongly centered. Thus, the process control and the resulting films of the process of the present invention are much improved over the prior art process.

Figure 16:
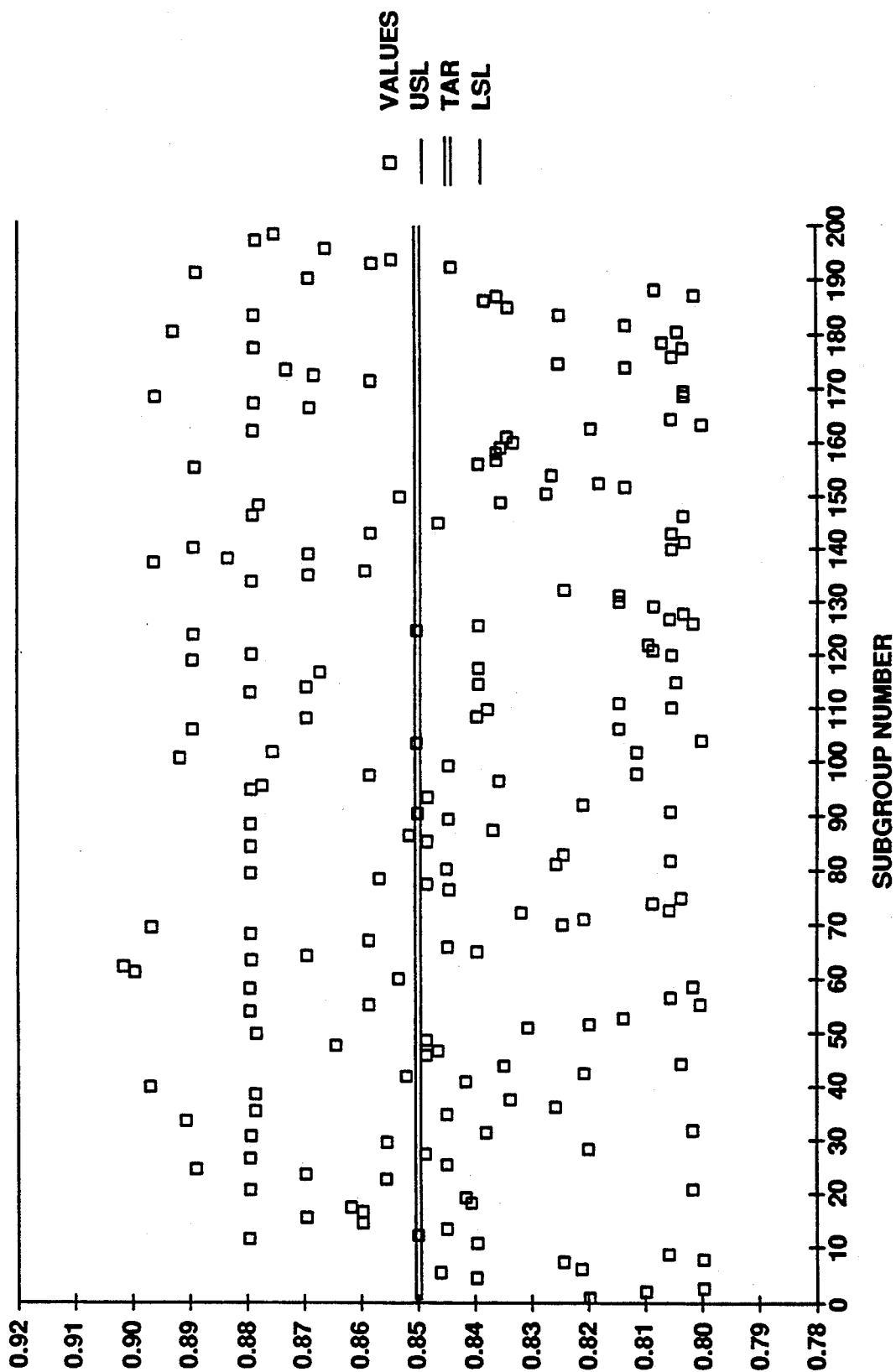
FIG. 16 depicts a trend chart of the present invention process after the wet selective etch.

Referring now to FIG. 16, a trend chart can be seen of the sheet resistance of the film of the present invention after the wet selective etch. With 196 wafers tested, the mean sheet resistance is 0.84 ohms per square with a standard deviation of 0.03. Given a starting titanium film thickness of approximately 900 Å, this translates to a bulk resistivity value of 7.56 micro ohm centimeters (versus a bulk resistivity value of 12.24 micro ohm centimeters with the two step annealing process of the prior art).

Figure 17:
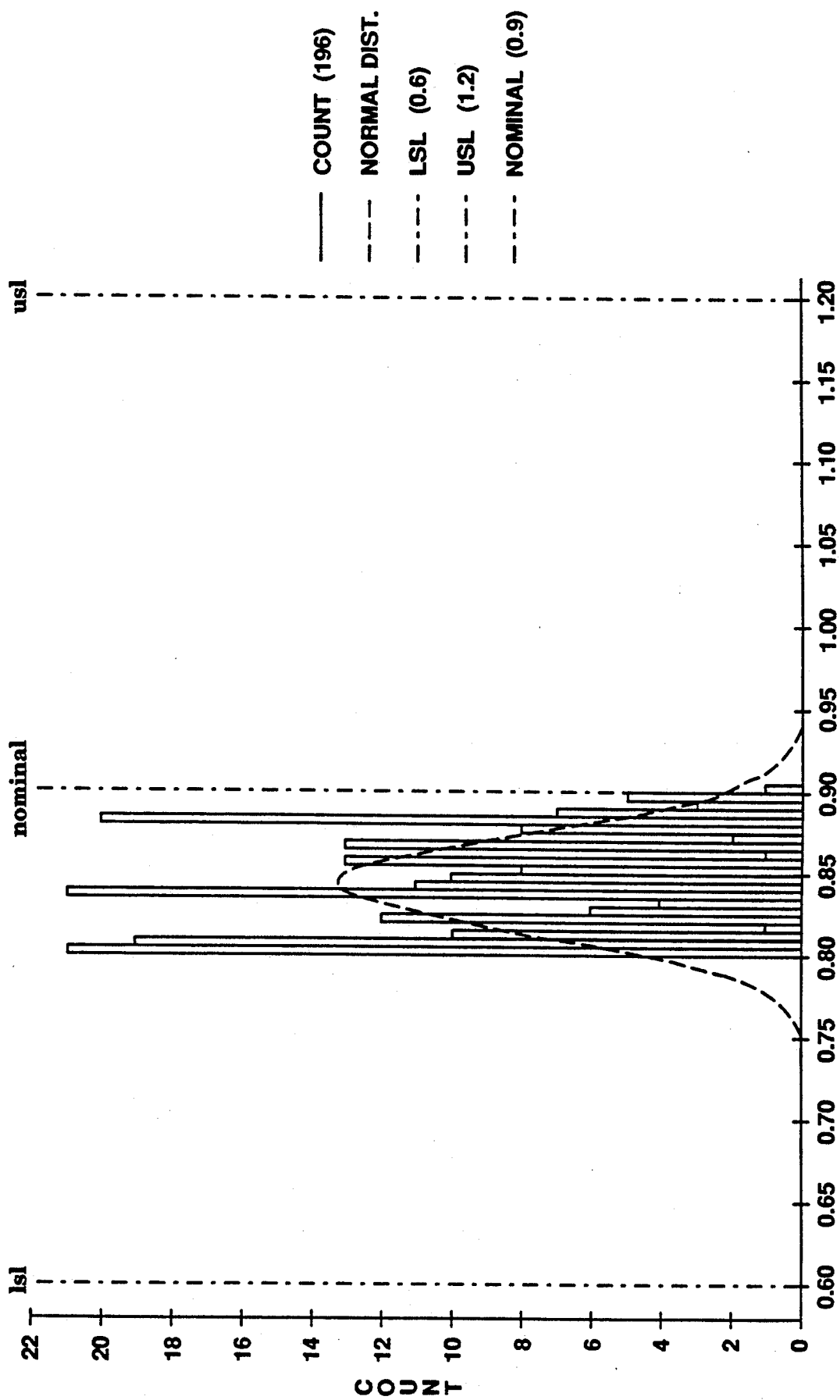
FIG. 17 depicts a capability plot of the present invention process after the wet selective etch.

Referring now to FIG. 17, a capability plot can be seen of the sheet resistance of the film after the wet selective etch. With 196 wafers tested and with a lower specification limit of 0.6 ohms per square and an upper specification limit of 1.2 ohms per square, the resulting Cp value is 3.39 and the resulting Cpk value is 2.76. Note that in FIG. 17 both Cp and Cpk are again much greater than 1 which again indicates that the resulting values with the process of the present invention are much improved over the prior art.

Figure 18:
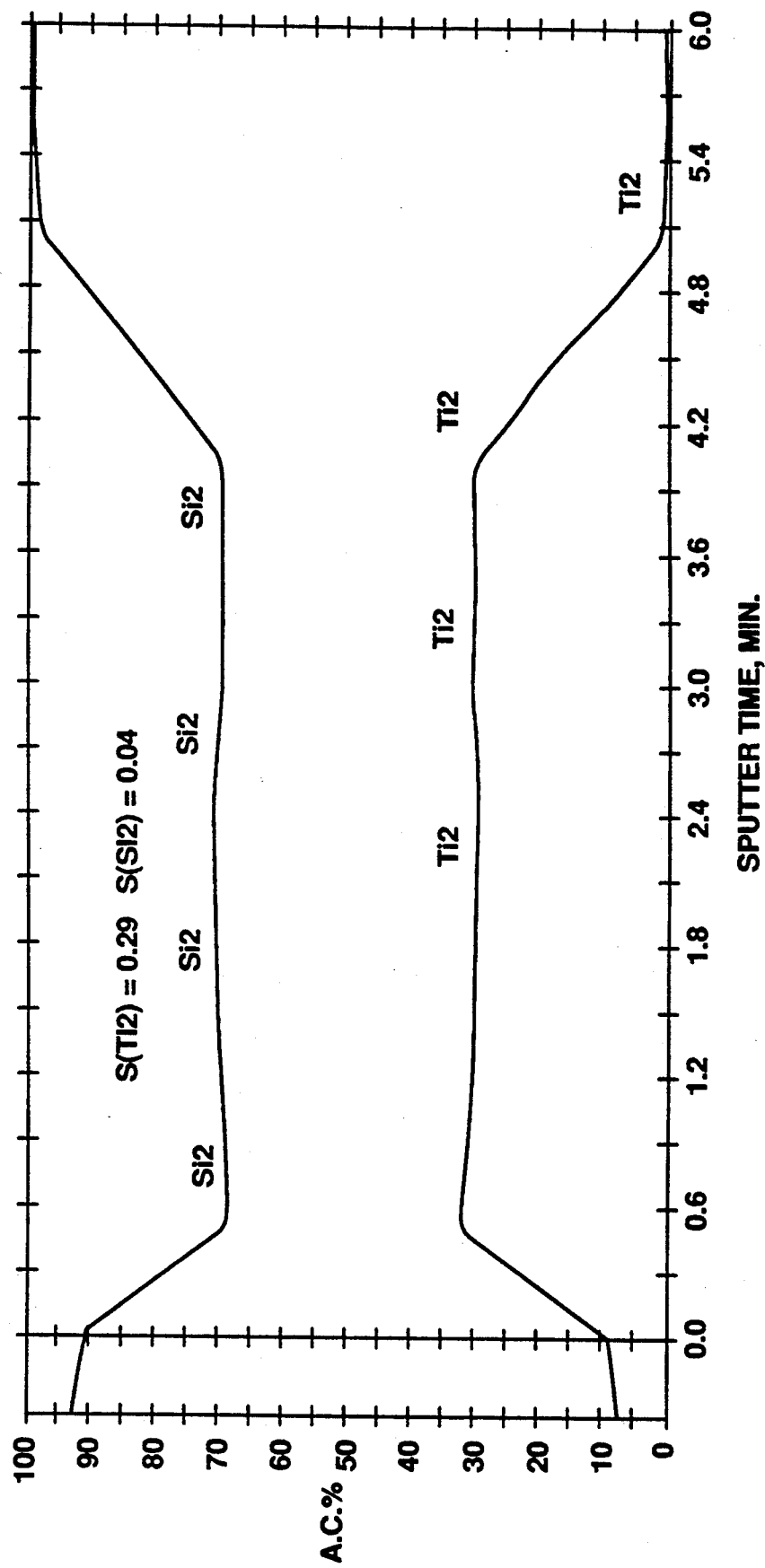
FIG. 18 depicts an auger analysis of the tisalicide film of a wafer of the present invention process.
Figure 19:
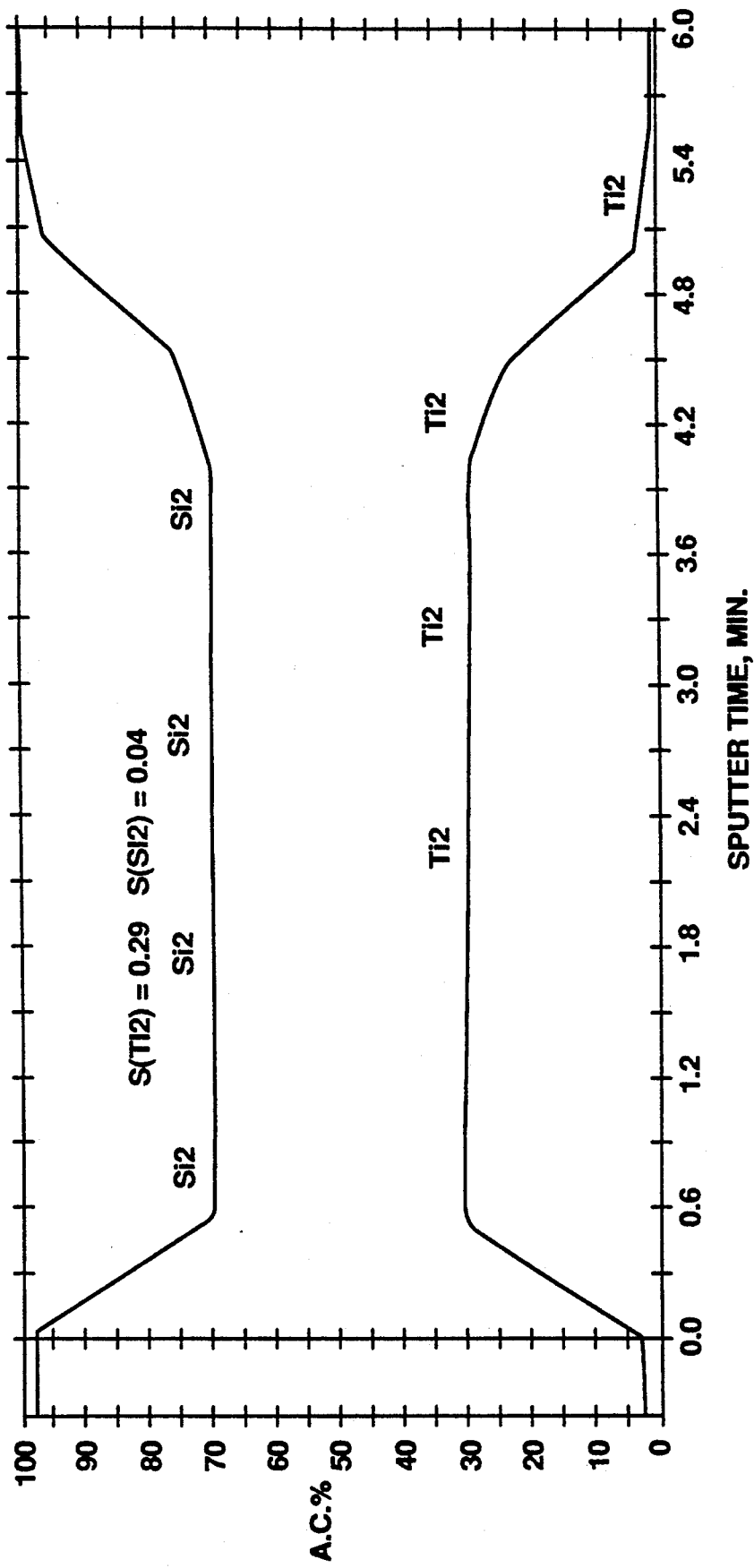
FIG. 19 depicts an auger analysis of the tisalicide film of another wafer of the present invention process.
Figure 20:
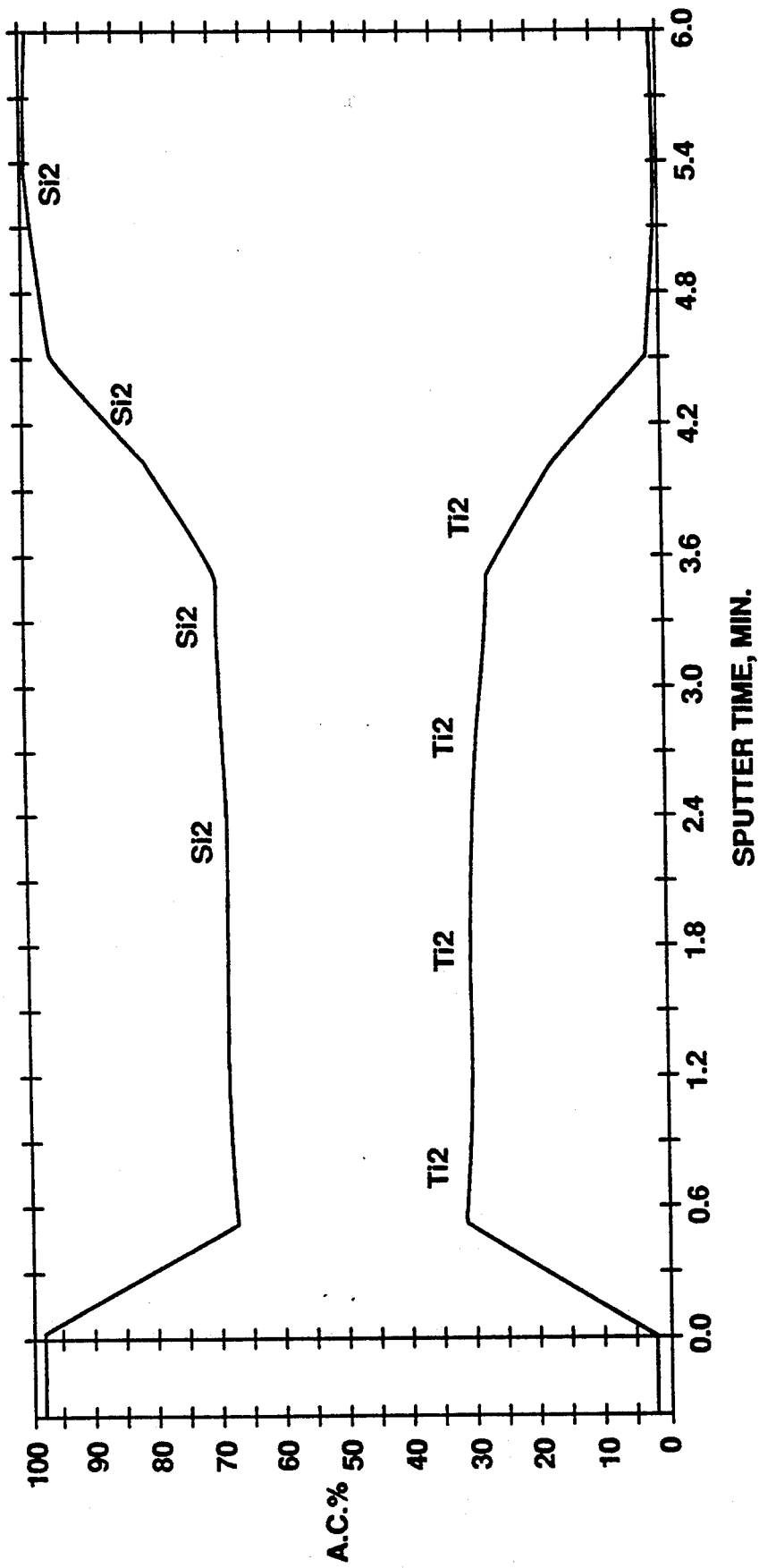
FIG. 20 depicts an auger analysis of the tisalicide film of still another wafer of the present invention process.

Referring now to FIGS. 18, 19 and 20, auger analyses for three separate wafers can be seen of the tisalicide film after the single step anneal and the wet selective etch process sequence of the present invention. The stoichiometry of the tisalicide calculated from the auger analyses of FIGS. 18, 19 and 20 each show a value of 2.2. Therefore, the tisalicide formed by the process of the present invention is almost entirely of the desired C54 phase (TiSi$_2$) of tisalicide and thus matches the film content of the prior art while eliminating the need for a second annealing step. Furthermore, as was stated above, the present process does not require such strict process parameters as does the prior art.

Figure 21:
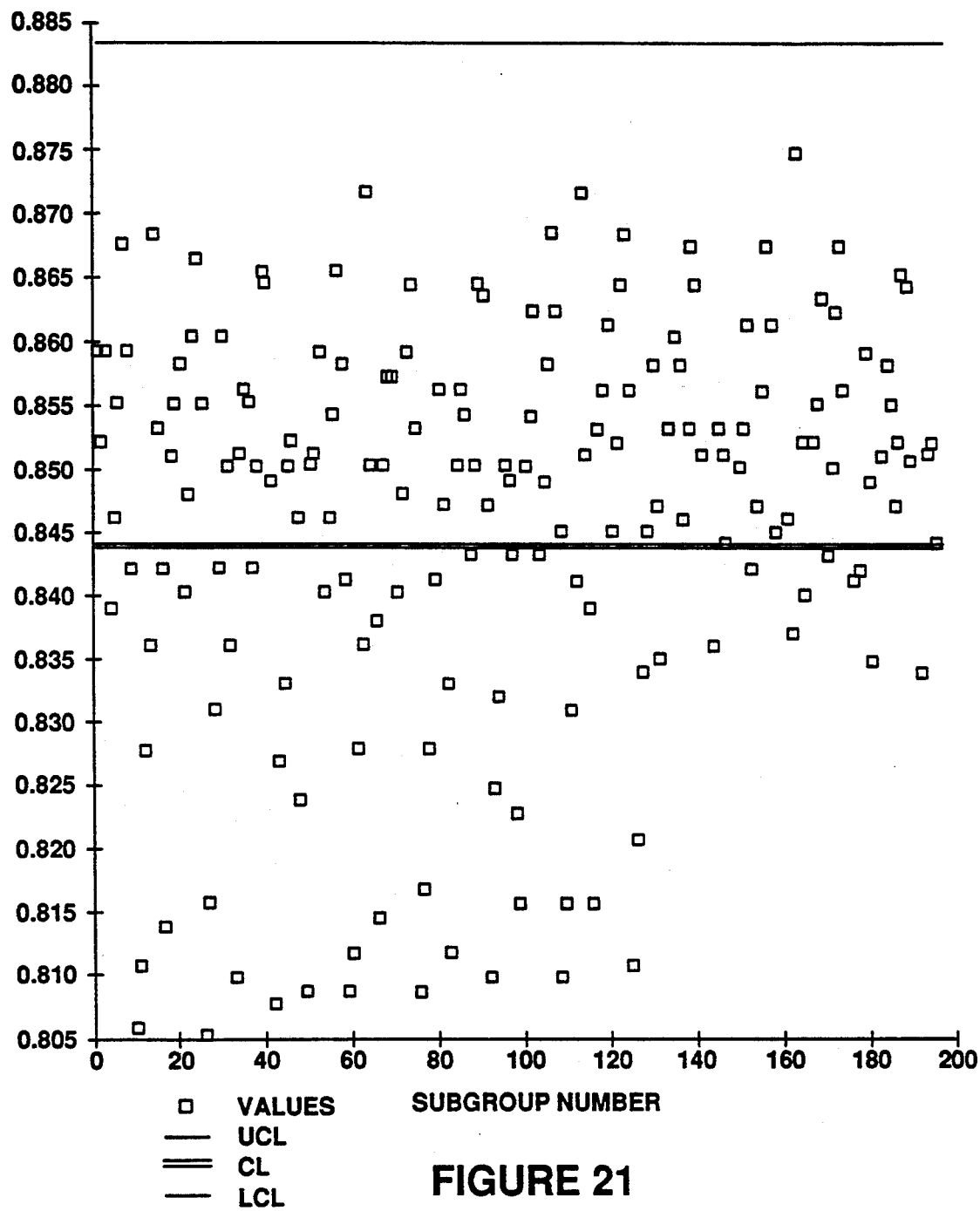
FIG. 21 depicts a trend chart of the present invention process after adding a second annealing step.

Referring now to FIG. 21, a trend chart can be seen of the sheet resistance of the film of the process of the present invention after adding a final high temperature anneal step as used in the prior art. With 196 wafers tested, the mean sheet resistance is still 0.84 ohms per square with a standard deviation of 0.02. This thus further shows that the single step anneal of the process of the present invention has eliminated the need for the second high temperature anneal step of the prior art process.

Comparison of Results of Prior Art Process Versus Present Invention Process

The following reviews in table format the measured values of sheet resistance and process uniformity for each step of both the prior art process and the process of the present invention. Again, these resulting values show that the process of the present invention eliminates the high temperature anneal step while still yielding films of equal or higher quality.

| Trend Analysis (prior art process) | | | | |
|---|---|---|---|---|
| After the process step of: | No. of wafers tested | Ave. Sheet Resistance (ohms/sq) | Std Dev. (ohms/sq) | Relevant Figure |
| titanium deposition | 248 | 6.79 | 0.22 | FIG. 3 |
| silicon implantation | 489 | 7.37 | 0.49 | FIG. 5 |
| low temp. anneal | 1100 | 7.98 | 0.37 | FIG. 7 |
| wet selective etch | 709 | 10.07 | 0.60 | FIG. 9 |
| high temp. anneal | 1000 | 1.37 | 0.17 | FIG. 11 |

| Trend Analysis (present invention process) | | | | |
|---|---|---|---|---|
| After the process step of: | No. of wafers tested | Ave. Sheet Resistance (ohms/sq) | Std Dev. (ohms/sq) | Relevant Figure |
| titanium deposition | 248 | 6.79 | 0.22 | FIG. 3 |
| silicon implantation | 489 | 7.37 | 0.49 | FIG. 5 |
| P.I. low temp anneal | 196 | 0.84 | 0.01 | FIG. 14 |
| P.I. wet selective etch | 196 | 0.84 | 0.03 | FIG. 16 |

| Capability Analysis (prior art process) | | | | |
|---|---|---|---|---|
| After the process step of: | No. of wafers tested | Cp (the higher the better) | Cpk (the higher the better) | Relevant Figure |
| titanium deposition | 248 | 2.28 | 1.84 | FIG. 4 |
| silicon implantation | 489 | 1.03 | 0.94 | FIG. 6 |
| low temp. anneal | 1100 | 3.12 | 2.70 | FIG. 8 |
| wet selective etch | 709 | 1.67 | 0.52 | FIG. 10 |
| high temp. anneal | 1000 | 1.95 | 0.71 | FIG. 12 |

| Capability Analysis (present invention process) | | | | |
|---|---|---|---|---|
| After the process step of: | No. of wafers tested | Cp (the higher the better) | Cpk (the higher the better) | Relevant Figure |
| titanium deposition | 248 | 2.28 | 1.84 | FIG. 4 |
| silicon implantation | 489 | 1.03 | 0.94 | FIG. 6 |
| P.I. low temp anneal | 196 | 4.15 | 3.94 | FIG. 15 |
| P.I. wet selective etch | 196 | 3.39 | 2.76 | FIG. 17 |

Another criteria by which semiconductor device fabrication processes are measured is film uniformity. Film uniformity indicates the degree to which the resulting film from a given process remains consistent (uniform) across each wafer, from wafer to wafer, and from run to run. Film uniformity as a percentage is determined by the following equation:

film uniformity (%) = (standard deviation × 100)/mean

Please note that the lower the resulting percentage the greater the film uniformity.

The following compares the film uniformity of the prior art process to the film uniformity of the present invention:

| | Std Dev | Mean | Uniformity % |
|---|---|---|---|
| prior art process: | 0.17 | 1.37 | 12.50% |
| present invention: | 0.013 | 0.84 | 1.54% |

The resulting film uniformity percentage, as shown above, of the single step salicidation process of the present invention is thus greatly improved over that of the two step annealing process of the prior art.

What is claimed is:

1. An improved method of fabricating a semiconductor device with mean sheet resistivity less than 1 ohm per square, said improved method comprising:
    a) forming active regions on said semiconductor device;
    b) depositing a titanium metal on said active regions;
    c) annealing said semiconductor device in a single step at a temperature within a range of 630° C.–650° C. and for approximately 90 seconds while maintaining nitrogen gas flow to produce an entirely C54 phase of tisalicide; and d) forming interconnects on said semiconductor device.

2. The method of claim 1 wherein said temperature is ramped at a rate of 90° C. per second.

3. An improved method of fabricating a semiconductor device, said improved method comprising:
   a) forming active regions on said semiconductor device;
   b) forming a gate on said semiconductor device;
   c) forming oxide spacers between said active regions and said gate;
   d) depositing a layer of titanium on said semiconductor device, the titanium layer having a thickness of approximately 900 Å;
   e) implanting silicon in said semiconductor device;
   f) annealing said semiconductor device in a single step at a temperature within a range of 630° C.-650° C. for approximately 90 seconds while maintaining a nitrogen gas flow to produce an entirely C54 phase of tisalicide; and
   g) etching said semiconductor device.

4. The method of claim 3 wherein said annealing is performed with a ramp rate of 90° C. per second.

5. The method of claim 4 wherein during said annealing said nitrogen gas flow has a rate of 2 liters per minute.

6. An improved method of reducing the mean sheet resistance of a device to less than 1 ohm per square on a semiconductor device before forming interconnects, said improved method comprising:
   a) depositing on said device a titanium metal, the titanium metal having a thickness of 900 Å; and
   b) annealing said titanium metal in a single step at a temperature within a range of 630° C.-650° C. for 90 seconds while maintaining a nitrogen gas flow to produce an entirely C54 phase of tisalicide.

7. The method of claim 6 wherein said annealing in step (b) is performed with a ramp rate of 90° C. per second.

8. The method of claim 7 wherein said nitrogen gas flow has a rate of 2 liters per minute.

* * * * *